United States Patent
Haq

[11] Patent Number: 6,043,005
[45] Date of Patent: Mar. 28, 2000

[54] POLYMER REMOVER/PHOTORESIST STRIPPER

[76] Inventor: Noor Haq, 21450 Mt. Eden Ct., Saratoga, Calif. 95070-5302

[21] Appl. No.: 09/089,937

[22] Filed: Jun. 3, 1998

[51] Int. Cl.[7] ............................ B08B 7/00; C11D 9/04; G03F 7/42
[52] U.S. Cl. ......................... 430/331; 134/38; 510/176
[58] Field of Search ..................... 134/38; 430/329, 430/331; 510/176, 430, 134

[56] References Cited

U.S. PATENT DOCUMENTS

| | | | |
|---|---|---|---|
| 4,744,834 | 5/1988 | Haq | 134/38 |
| 5,215,675 | 6/1993 | Wilkins et al. | 252/100 |
| 5,290,365 | 3/1994 | Whitton | 134/38 |
| 5,334,331 | 8/1994 | Fusiak | 252/542 |
| 5,597,678 | 1/1997 | Honda et al. | 430/331 |
| 5,830,836 | 11/1998 | Smith et al. | 510/212 |
| 5,911,836 | 6/1999 | Hada et al. | 134/2 |

*Primary Examiner*—Janet Baxter
*Assistant Examiner*—Rosemary Ashton
*Attorney, Agent, or Firm*—The Kline Law Firm

[57] ABSTRACT

A chemical composition which is useful for removing photoresist and polymers from substrates. The composition comprises 10 to 90% by weight of 2-pyrrolidinone compound of the formula $C_5H_9NO$, 10 to 50% by weight of lactic acid of the formula $C_3H_6O_3$, and 10 to 50% by weight of a peroxide compound. The composition of the present invention is particularly useful for cleaning photoresist and removing tough polymers from semiconductor wafer substrates.

18 Claims, No Drawings

POLYMER REMOVER/PHOTORESIST STRIPPER

FIELD OF THE INVENTION

The present invention is a composition of matter useful for removing polymers and stripping photoresist from substrates and a method of removing photoresist and polymers utilizing such composition.

BACKGROUND OF THE INVENTION

Current art semiconductor device manufacturing technology utilizes positive photoresist materials to photolithographically delineate patterns on substrates. These patterns are etched by wet or dry etching techniques later in the manufacturing process and are either left permanently or removed during processing. One class of machines used in etching these patterns are plasma etching systems. Several manufacturers in the United States, Japan, and Europe manufacture them. Commercially available systems include the Applied Material 5000, the Lam Rainbow etchers, the Tegal plasma etchers, Anelva etchers, and others.

The photoresist patterns can be etched with different mixtures of organic and inorganic chemicals. The systems used for the wet etching are called Wet-Benches. Several manufacturers manufacture these wet-benches made of Polypropylene, Teflon, and sometimes Stainless Steel. The chemical mixtures used are Sulfuric Acid, Hydrofluoric Acid, Acetic Acid, and the like. Sometimes these acid mixtures are used at room temperature, and sometimes they are heated from 25° C.–160° C. The positive photoresist materials are spun onto substrates or are otherwise applied to substrates.

The substrates are then exposed to UV light utilizing different types of exposure machines. After exposure, the substrates are subjected to a development process where, due to selective dissolution of certain areas of the photoresist, a pattern is developed. The resist in certain areas is completely removed by this process step. In certain other areas, resist is left behind to protect the underlying metal or dielectric films.

The resist layer may then be exposed to deep UV blanket light or baked at high temperatures in order to stabilize the resist, which enables the resist to withstand the plasma etching process. The blanket UV exposure also improves the aspect ratio of etching metal or dielectric and the photoresist. The baking temperatures may range from 90° C. to 250° C. for from 30 seconds to 120 seconds. This treatment improves resist selectivity and provides better etching and dimensional controls of etched patterns. It also enables engineers to go up to and more than 200% over etch in order to ensure that desired etching material, whether it is a metal or a dielectric film, is completely gone from the area and no traces are left behind in between patterned lines or inside holes.

The remaining photoresist material is then further exposed to dry etching or wet etching procedures as required by the manufacturing process. The etching process is essential to define the patterns and leave behind under the photoresist pattern the metal or dielectric film, oxide, poly or other insulator film. The underlying layer is utilized later in the process of manufacturing semiconductor chips.

It is necessary in such full lithographic processes to ensure that the photoresist material, following pattern delineation, is evenly and completely removed from all unexposed areas of the substrate so as to permit further operations. Even minute traces remaining of the photoresist material or resist coating in an area to be further processed are highly undesirable. Residue of the photoresist material or resist coating can have a detrimental yield impact.

The objective of the plasma etching processes or wet etching process is to remove metal films such as Titanium, Titanium-Tungsten alloy, Aluminum, Aluminum Silicon Copper alloy, Titanium Nitride films, or Spin on glass films, BPSG (Borophosphate silicate glass) films, or films of a similar nature, that a thin film on the sides of the patterns is redeposited as either a metal line or a hole in the dielectric film. These redeposit films are identified by many different names, such as metal veils, side wall polymers, passivation polymers, photoresist polymers, via veils, via polymers, fences, tulips, etc. The redeposit films are organometallic residues that are formed and redeposited onto the substrates. These residual polymers are hard, and are very difficult to remove by conventional strippers or oxygen plasma. One reason that removal of the residual polymers is difficult is that it is very important that the photoresist stripper does not attack nor make a slight change on the exposed metal lines or via hole sidewalls. The photoresist stripper should remove all resist as well as polymer from the substrate.

Conventional resist strippers or polymer removers available on the market are typically made with either Hydroxyl Amine, Pyrollidone, Glycol ethers, Dimethyl sulfides, or ethanol. Other types of Acid mixtures, such as sulfuric acid heated to 120° C. and added to approximately 200–500 ML of hydrogen peroxide to create a strong oxidizing agent, are used to strip resists from substrates. This type of mixture can only be used prior to the deposition of any metal layer, because the mixture can strip all the metal from the substrate. If the sulfuric acid/hydrogen peroxide mixture is used on substrate with metal applied, the metal may be stripped from the substrate, which can require that the substrate be scrapped. This can be a significant financial loss for the manufacturer.

The prior art resist strippers and polymer removers are all subject to some drawbacks. HDA-based strippers/polymer removers have limited effective temperature operating ranges. If the chemical temperature is raised above 65° C., the stripper attacks underlying metals, such as Titanium, Nickel, Titanium Nitride, Aluminum and the like, causing manufacturing defects.

HDA types of chemistry are subject to the drawback of attacking SOG (spin on glass) films, especially SOG films which have low dielectric constants. Another drawback of HDA formulations are their evaporation rate. Further, HDA chemistries are very toxic. Disposal is therefore very expensive.

Another type of chemicals used for stripping purposes are mixtures of Anhydrous Ammonium fluorides in Ethylene Glycols. These mixtures pose the dangers of attacking SOG severely and also attacking metal films of the types mentioned above. The mixtures include Hydrofluoric Acid, thus requiring the use of hazardous waste disposal techniques.

Accordingly, it is an object of the present invention to provide stripping formulation a that effectively removes photoresist material or resist coating.

It is a further object of the present invention to provide a stripping formulation that does not attack SOG or metal films.

It is a still further object of the present invention to provide a stripping formulation that is not highly toxic so that it can be disposed of easily.

SUMMARY OF THE INVENTION

The present invention is a chemical composition which is useful for removing photoresist and polymers from substrates. The composition comprises 10 to 90% by weight of 2-pyrrolidinone compound of the formula $C_5H_9NO$, 10 to 50% by weight of lactic acid compound of the formula $C_3H_6O_3$, and 10 to 50% by weight of hydrogen peroxide compound of the formula $H_2O_2$. The composition of the present invention is particularly useful for cleaning photoresist and removing tough polymers from semiconductor wafer substrates.

An advantage of the present invention is that it effectively removes photoresist material or resist coating from wafer substrates.

Another advantage of the present invention is that it does not attack SOG or metal films.

A still further advantage of the present invention is that it is not toxic.

These and other objects and advantages of the present invention will become apparent to those skilled in the art in view of the description of the best presently known mode of carrying out the invention as described herein.

DETAILED DESCRIPTION OF THE INVENTION

The present invention is a composition adapted to clean polymers and strip resist from wafer substrates. The composition of the preferred embodiment of the present invention includes 10% to 90% by weight of a 2-pyrrolidinone compound with the following structure:

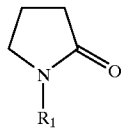

where R1 is a hydrogen alkyl of 1 to 3 carbon atoms and hydroxyalkyl of 1 to 3 carbon atoms. Examples of 2-pyrrolidinone compounds of the above which are suitable for use in the composition of the present invention include 2-pyrrolidinone, 1-methyl-2-pyrrolidinone, 1-ethyl-2-pyrrolidinone, 1-propyl-2-pyrrolidinone, 1-hydroxymethyl-2-pyrrolidinone, 1-hydroxyethyl-2-pyrrolidinone, and 1-hydroxypropyl-2-pyrrolidinone. The composition of the present invention must include 10% to 90% by weight of the 2-pyrrolidinone compound. The composition's effectiveness is improved if the percent by weight of the 2-pyrrolidinone compound is 50% to 80%. It has been determined by the inventor that the optimal weight percent of the 2-pyrrolidinone compound is approximately 60%.

The second component of the composition of the present invention is a lactic acid with the following structure:

$CH_3$—$CH(OH)$—$COOH$

Examples of lactic acid compounds which are suitable for use in the composition of the type of present invention, include 2-hydroxypropionic acid, ethylidene lactic acid, and 1-hydroxyethane carboxylic acid. The composition must include 10% to 50% by weight of the lactic acid. The composition's effectiveness is improved if the percent by weight of the lactic acid is 15% to 25%. It has been determined by the inventor that the optimal weight percent of the lactic acid is approximately 20%.

The third necessary component of the composition of the present invention is a hydrogen peroxide with the following structure:

H—O—O—H

A preferred hydrogen peroxide is peroxycarboxylic acid, with the formulation

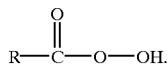

The composition of the present invention must include 10% to 50% by weight of the hydrogen peroxide compound. The composition's effectiveness is improved if the percent by weight of the hydrogen peroxide compound is 15% to 25%. It has been determined by the inventor that the optimal weight percent of the hydrogen peroxide compound is approximately 20%.

On formulation of the composition of the present invention that has been found to be particularly effective comprises about 60% by weight of 2-pyrrolidinone, about 20% by weight of lactic acid, and about 20% by weight of hydrogen peroxide.

It is to be understood that it is not necessary that all of the 2-pyrrolidinone compound, the lactic acid, and the hydrogen peroxide be a single composition. That is, within each of the three essential classes of the ingredients of the composition of the present invention, mixtures of compounds may be utilized as opposed to pure compounds.

The photoresist stripping or polymer removal composition of the present invention may be utilized generally in the same manner as are other photoresist removing or polymer removing compositions. That is, the composition may be used to strip off a photoresist material or remove polymer material from a substrate by contacting the substrate and the composition. The photoresist or polymer material can be stripped off in a "hot pots" method.

In the "hot pots" method the stripping composition of the present invention is poured into a hot bath. The temperature of the bath will generally range from about room temperature to 100° C. Substrates which are to be cleaned, resist stripped, or polymer removed are placed in the hot bath from 5 to 60 minutes. The substrates are then removed from the bath, rinsed with deionized water, and then spun dry.

Alternatively, an automated system can be used wherein the stripper or polymer remover composition is part of an automated stripping system. In automated stripping systems, substrates may be held in cassettes, or placed on a belt, or placed one at a time by robots on a chuck. The chemical bath is heated and poured onto the substrates either while the substrates are stationary or while the substrates are rotating.

In some applications, the first two components of the present invention, 2-pyrrolidinone and lactic acid, are premixed and heated to 80° C. The third component, hydrogen peroxide, is mixed with the heated components at the time of use. In some cases, the premixed composition is routed through hot tanks and the preheated compound is delivered to the substrate either through a spray mode or through a puddle and then spun onto the substrates to strip resist or remove polymer.

The composition of the present invention is very effective in stripping and removing tough plasma etched polymers on Poly mask, Contact masks, Via masks, Metal masks and Pad masks levels. It is particularly useful when semiconductor wafers are subjected to very tough plasma etched conditions, where the polymer formation is very heavy due to over etching or due to reticulated resist. The composition of the present invention is very useful in stripping photoresist, where photoresist containing silicon impurities and photoresist is subjected to HMDS vapors. The present invention is very effective in stripping that type of photoresist. The present invention is very effective in stripping Deep UV baked photoresist. Thus it is very effective when substrates coated with photoresist are exposed to blanket UV for stabilizing the photoresist and enhancing its properties to stand against harsh plasma etching of either poly, contacts, via holes, metal masks and pad mask level geometries. It is particularly useful when substrates are heated from 120° C. to 300° C. after coating with photoresist, exposing and after developing the photoresist. The baking is done in a conventional oven or on a hot plate. Also the composition is very useful in stripping photoresist from wafers after high energy implant, high current and high dose implanted wafers. Such wafers are prepared when bare silicon wafers or Gallium Arsenide wafers have an oxide layer of 100 Angstrom to 2000 Angstrom thermally grown upon them. Then $Si_3N_4$ approximately 800 Angstrom to 2000 Angstroms in thickness is grown or deposited on the oxide layer. The wafers are then subjected to photomasking operation n which photoresist is aplied and a pattern is delineated. The wafers are then subjected to high energy, high current, high dosage implantation. The substates are implanted with different impurities such as arsenic, phosphorous, boron, antimony, zinc, or the like. The dosage levels used are in the range of $0.5 \times 10^{12}$ to $0.5 \times 10^{16}$ atoms/cm². The wafers are subjected to high energy and high current. During this process the photoresist becomes very hard and is very difficult to remove with conventional techniques. The composition of the current present invention efficiently cleans and strips the hardened resist from such substrates.

The composition of the present invention is very effective in cleaning photoresist and removing polymers from plasma etched wafers from the so-called double, triple, and quadruple and five-level metal process. Multiple metal level processes are used in the semiconductor industry to reduce the chip size as well as improve chip speed. By doing so the metal interconnects are shortened and the speed of the chip is improved. In these multiple level metallization process it is very difficult to remove photoresist and polymers. These polymers are formed on the side walls of the metal lines. The composition of the present invention effectively removes polymers and photoresist materials by entering between the small metal lines and in the small vias and removing the polymers and photoresist very effectively.

The stripping composition of the present invention is also very effective in removing polymers and stopping metal corrosion from copper interconnects. Copper interconnect is a new technology which is currently being developed by many semiconductor chip manufacturers. Copper interconnects will replace current technology which utilizes Aluminum, Silicon, and copper alloy. The purpose of using 100% copper as a replacement for so called aluminum interconnects is to improve chip speed. Copper being an excellent conductor will improve chip speed by 1000 fold. There are two different methods of defining copper lines. One method which is being used in manufacturing today is called the Damascene process and the other method is directly etching copper lines with plasma. Damascene process is defined as a process where substrates are first coated with photoresist. Line patterns are defined with conventional photomasking process and the pattern is developed with aqueous based developer. After defining this pattern, substrates are either sputtered with copper, or copper is deposited by electrolysis. In either case copper fills the openings between the areas of resist. Then the resist is removed by plasma or wet chemistry. The remaining pattern is copper lines that are used to connect several different circuits on the chip. The other method of defining copper lines is to coat wafers with either sputtered copper or with a film of copper deposited by electrolysis. Then an oxide layer is deposited on top of the copper film. This oxide layer is then coated with conventional photoresist and metal masks is exposed on to the wafer. Oxide layer is etched with conventional oxide etching methods such as via level mask is etched with fluorine chemistry in a conventional etching system. After etching oxide the photoresist is removed by wet chemistry and side wall polymer is also removed. The present invention is very effective in removing this side wall polymer and photoresist from oxide level. Then copper is etched with plasma using oxide as a hard mask. It is during and after etching that copper lines grow crystals on the sides. These crystals are composed of copper sulphates. These side wall crystals growth is detrimental to chip yield and causes electrical defects and other problems. After copper plasma etching, if the substrates are left in the open, these crystals continue to grow and do not stop growing. These crystals infiltrate the entire pattern and pose a major problem for the chip manufacturer. These crystals are called copper polymer. The present invention is very effective in removing side walls copper polymer and stops further growth of these crystals. The present invention is very effective in passivating the copper lines.

Comparative analysis—Test 1: The photoresist stripping and polymer removal composition of the present invention and of two stripping compositions which included one and two of the ingredients of the present invention were experimentally tested. The compositions tested had the following makeup (all shown as percents by weight):

A: N-Methyl-2-Pyrrolidinone (NMP)

B: 80% NMP and 20% $H_2O_2$

C: 60% NMP, 20% $H_2O_2$, and 20% Lactic Acid

Substrates with coated photoresist and plasma etched via and metal lines were prepared. Polymers were verified by SEM pictures before treatment with any of the compositions. Via substrates were made by conventional plasma etched via holes over metal lines. Metal masks substrates were made by conventional metal line masks over dielectric film previously defined with via holes. Copper interconnect substrates were prepared with a $SiO_2$ hard mask.

Equal amounts of compositions A, B, and C were each heated to 80° C. in three beakers on a hot plate. The substrates were subjected to the three compositions for a time of 20 minutes each. The substrates were then rinsed with deionized water for three to four minutes and blown dry with $N_2$. Samples were placed in an SEM to check for removal of photoresist and in particular for removal of via polymer, aluminum polymer and copper polymer.

Compositions A and B did not remove the photoresist or polymer completely. Composition C removed 100% of the photoresist and polymer.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

I claim:

1. A composition of matter adapted to remove polymers and photoresist materials from a substrate, said composition comprising:

10% to 90 % by weight of a 2-pyrrolidinone of the formula

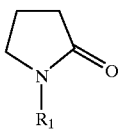

where R1 is a hydrogen, alkyl of 1 to 3 carbon atoms and hydroxyalkyl of 1 to 3 carbon atoms, 10% to 50% by weight of lactic acid of the formula $CH_3$—$CH(OH)$—$COOH$, and 10% to 50% by weight of a peroxide wherein the peroxide is hydrogen peroxide or a peroxycarboxylic acid.

2. The composition of matter defined in claim 1 wherein:
said 2-pyrrolidinone is 2-pyrrolidinone, 1-methyl-2-pyrrolidinone, 1-ethyl-2-pyrrolidinone, 1-propyl-2-pyrrolidinone, 1-hydroxymethyl-2-pyrrolidinone, 1-hydroxyethyl-2-pyrrolidinone, or 1-hydroxypropyl-2-pyrrolidinone.

3. The composition of matter defined in claim 1 wherein:
said peroxide is peroxycarboxylic acid.

4. The composition of matter defined in claim 1 wherein:
the weight percentage of said 2-pyrrolidinone is 50% to 80%.

5. The composition of matter defined in claim 1 wherein:
the weight percentage of lactic acid is 15% to 25%.

6. The composition of matter defined in claim 1 wherein:
the weight percentage of said peroxide is 15% to 25%.

7. A method of removing polymers and stripping photoresist from a substrate comprising:
causing the composition of claim 1 to come into contact with the substrate.

8. A method of removing polymers and stripping photoresist from a substrate comprising:
causing the composition of claim 2 to come into contact with the substrate.

9. The method defined in claim 8 wherein:
at least one component of said composition is heated.

10. A method of removing polymers and stripping photoresist from a substrate comprising:
causing the composition of claim 3 to come into contact with the substrate.

11. The method defined in claim 10 wherein:
at least one component of said composition is heated.

12. A method of removing polymers and stripping photoresist from a substrate comprising:
causing the composition of claim 4 to come into contact with the substrate.

13. The method defined in claim 12 wherein:
at least one component of said composition is heated.

14. A method of removing polymers and stripping photoresist from a substrate comprising:
causing the composition of claim 5 to come into contact with the substrate.

15. The method defined in claim 14 wherein:
at least one component of said composition is heated.

16. A method of removing polymers and stripping photoresist from a substrate comprising:
causing the composition of claim 6 to come into contact with the substrate.

17. The method defined in claim 16 wherein:
at least one component of said composition is heated.

18. The method defined in claim 7 wherein:
at least one component of said composition is heated.

* * * * *